United States Patent
Huang et al.

(10) Patent No.: US 6,403,487 B1
(45) Date of Patent: *Jun. 11, 2002

(54) METHOD OF FORMING SEPARATED SPACER STRUCTURES IN MIXED-MODE INTEGRATED CIRCUITS

(75) Inventors: Cheng-Han Huang, Hsinchu; Meng-Jin Tsai, Hsinchu Hsien; Cheng-Jung Hsu, Hsinchu; Po-Hung Chen, Taipei, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/991,192

(22) Filed: Dec. 16, 1997

(30) Foreign Application Priority Data

Sep. 13, 1997 (TW) .......................................... 86113314

(51) Int. Cl.[7] ............................................. H01L 21/302
(52) U.S. Cl. ....................... 438/706; 438/710; 438/713; 438/714; 438/719
(58) Field of Search ................................ 438/157, 184, 438/196, 197, 211, 230, 267, 286, 303, 304, 714, 710, 713, 719, 706

(56) References Cited

U.S. PATENT DOCUMENTS 5,770,493 A * 6/1998 Fulford, Jr. ................. 438/199
5,827,761 A * 10/1998 Fulford, Jr. et al. ........ 438/199

* cited by examiner

Primary Examiner—Benjamin L. Utech
Assistant Examiner—Vanessa Perez Ramo

(57) ABSTRACT

A method is provided for forming separated spacer structures in a mixed-mode integrated circuit, which can be used to form spacer structures with different widths for the various kinds of devices in the mixed-mode integrated circuit. The method is for use on a semiconductor substrate which is formed with at least a first gate for a first kind of device of the mixed-mode integrated circuit and a second gate for a second kind of device of the integrated circuit, with the second gate being larger in width than the first gate such that the first gate is formed with a first spacer structure on the sidewalls thereof to a first desired width while the second gate is formed with a second spacer structure on the sidewalls thereof to a second desired width larger than the first desired width. The method features a two-step etching process in which the first etching process is performed to form one spacer structure to the first desired width, while the second etching process is performed to form the other spacer structure to the second desired width.

26 Claims, 4 Drawing Sheets

METHOD OF FORMING SEPARATED SPACER STRUCTURES IN MIXED-MODE INTEGRATED CIRCUITS

BACKGROUND OF THE INVENTION

1. Field of the Invention

This invention relates to semiconductor fabrication technologies, and more particularly, to a method of forming separated spacer structures in mixed-mode integrated circuits through a two-step etching process.

2. Description of Related Art

A mixed-mode integrated circuit is an integrated circuit in which at least two kinds of semiconductor devices with different purposes are provided. For instance, an integrated circuit having a memory device and a logic device integrated therein is a mixed-mode integrated circuit. Conventional mixed-mode integrated circuits include embedded dynamic random access memory (embedded DRAM), embedded static random access memory (SRAM), and application-specific integrated circuit (ASIC), to name a few. In accordance with the IC design rule, the various kinds of semiconductor devices in a mixed-mode integrated circuit should be applied with different operating voltages to the respective gates thereof. For instance, for a first kind of semiconductor device having a gate oxide layer of thickness 50 Å (angstrom) and a gate of thickness 0.25 µm (micrometer), the gate voltage applied thereto is about 2.5 V (volt); for a second kind of semiconductor device having a gate oxide layer of thickness 70 Å and a gate of thickness 0.34 µm, the gate voltage applied thereto is about 3.3 V; and for a third kind of semiconductor device having a gate oxide layer of thickness 130 Å and a gate of thickness 0.5 µm, the gate voltage applied thereto is about 5 V.

In a mixed-mode integrated circuit, each of the various kinds of semiconductor devices has its own unique spacer structure with a different spacer width from others for the purpose of providing a suitable channel resistance. An overly small spacer width would cause an overly strong electric field between source and drain, which can cause such undesired problems as hot-carrier problem or short-channel problem that would raise the reliability issue to the associated device. By contrast, an overly large spacer width would cause the problem of an insufficient driving current between source and drain. Conventional semiconductor fabrication technologies, however, fail to provide a suitable method that can be used to form spacers with different widths for the various kinds of devices in a mixed-mode integrated circuit.

SUMMARY OF THE INVENTION

It is therefore an objective of the present invention to provide a method for forming separated spacer structures in a mixed-mode integrated circuit, which can be used to form spacer structures with different widths for the various kinds of devices in the mixed-mode integrated circuit.

In accordance with the foregoing and other objectives of the present invention, a method for forming separated spacer structures in a mixed-mode integrated circuit is provided. Two preferred embodiments of the method of the invention are disclosed.

The first preferred embodiment of the method of the invention includes the following procedural steps of:

(1) preparing a semiconductor substrate which is formed with at least a first gate for the first kind of device of the mixed-mode integrated circuit and a second gate for the second kind of device of the mixed-mode integrated circuit;

(2) forming an insulating layer which covers both of the first gate and the second gate;

(3) forming a first etching mask which covers a first surface area of the insulating layer that is located above the second gate while exposing a second surface area of the insulating layer that is located above the first gate;

(4) performing a first etching process on the insulating layer using the first etching mask so as to remove part of the insulating layer until the insulating layer, having a first remaining part of a first desired width and serving as a first spacer structure is left on the sidewalls of the first gate; then removing the first etching mask;

(5) forming a second etching mask which covers the first gate and the first spacer structure while exposing a surface area of the insulating layer above the second gate; and (6) performing a second etching process on the insulating layer using the second etching mask so as to remove part of the insulating layer until the insulating layer, having a second remaining part of a second predetermined width; and serving as a second spacer structure is left on the sidewalls of the second gate, the second predetermined width, being different than the first predetermined width then removing the second etching mask.

The second preferred embodiment of the method of the invention includes the following procedural steps of:

(1) preparing a semiconductor substrate which is formed with at least a first gate for the first kind of device of the mixed-mode integrated circuit and a second gate for the second kind of device of the integrated circuit, the second gate being larger in width than the first gate, the first gate being formed with a first spacer structure, having a first predetermined width, on the sidewalls thereof while the second gate is to be formed with a second spacer structure, having a predetermined width, on the sidewalls thereof, the second predetermined width being larger than the first predetermined width;

(2) forming an insulating layer which covers both of the first gate and the second gate;

(3) performing a first etching process on the insulating layer so as to remove part of the insulating layer until a first remaining part and a second remaining part serving respectively as the first spacer structure and the second spacer structure are left on the sidewalls of the first gate and the second gate, respectively, the first and second spacer structures being etched to the second predetermined width;

(4) forming an etching mask which covers the second gate and the second spacer structure while exposing the first gate and the first spacer structure; and (5) performing a second etching process on the first spacer structure using the etching mask so as to further remove a surface part of the first spacer structure until the width of the first spacer structure is reduced to the first predetermined width; then removing the second etching mask.

Through the foregoing steps, two spacer structures with different widths for the various kinds of devices in the same integrated circuit can be made.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, two preferred embodiments are disclosed herein, which will be described in detail hereinafter with reference respectively to FIGS. 1A–1F and FIGS. 2A–2E. In these embodiments, for example, the mixed-mode integrated circuit includes at least a first kind of device and a second kind of device, and the method is used to form at least two separated spacer structures respectively for the first kind of device and the second kind of device in the mixed-mode integrated circuit.

First Preferred Embodiment

FIGS. 1A through 1F are schematic diagrams used to depict the steps involved in the first preferred embodiment of the method of the invention for forming a number of, for example two, separated spacer structures in a mixed-mode integrated circuit.

Figure 1A:
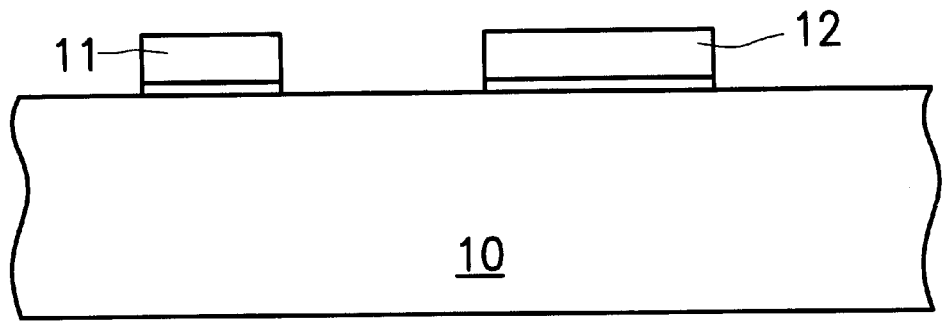
FIGS. 1A through 1F are schematic diagrams used to depict the steps involved in a first preferred embodiment of the method of the invention for forming two separated spacer structures in a mixed-mode integrated circuit.

Referring to FIG. 1A, in the first step, a semiconductor substrate 10 is prepared, which is then formed with a first gate 11 for a first kind of semiconductor device in the mixed-mode integrated circuit and a second gate 12 for the second kind of semiconductor device in the integrated circuit. In the case of FIG. 1A, for example, the first gate 11 is smaller in width than the second gate 12. In a practical case, for example, the width of the fist gate 11 is 0.25 $\mu$m; while the width of the second gate 12 is 0.34 $\mu$m or 0.5 $\mu$m.

Figure 1B:
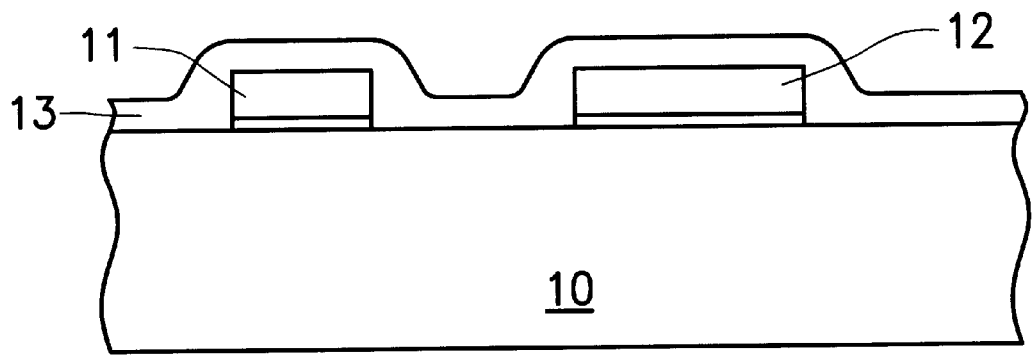
Figure 1C:
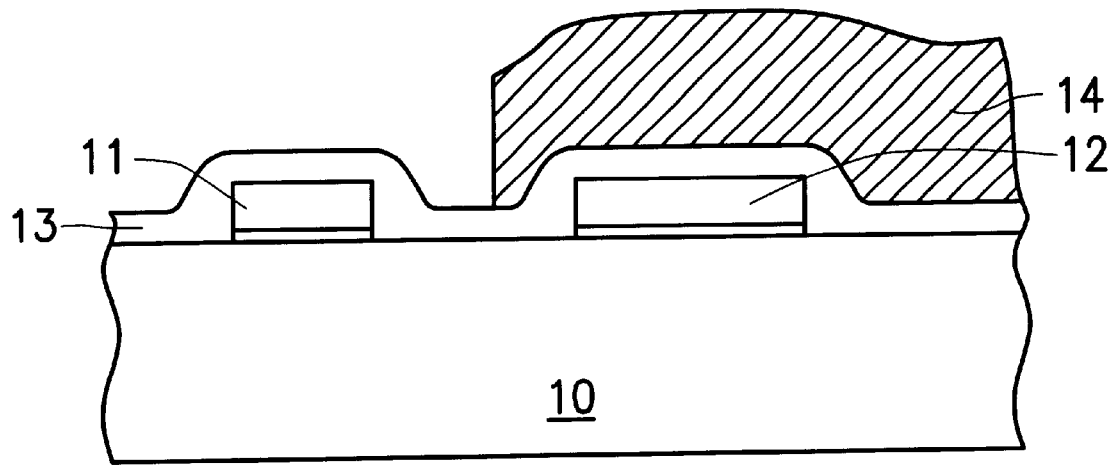

Referring next to FIG. 1B, in the subsequent step, an insulating layer 13, such as a layer of oxide or silicon nitride (SiN), is formed over the entire top surface of the wafer to a thickness of from 500 Å to 3,000 Å, covering both of the first gate 11 and the second gate 12, Referring next to FIG. 1C, in the subsequent step, a first photoresist layer 14 is formed over the wafer, which is then selectively removed to form an etching mask that covers the surface area of the insulating layer 13 above the second gate 12 while exposing the surface area of the insulating layer 13 above the first gate 11.

Figure 1D:
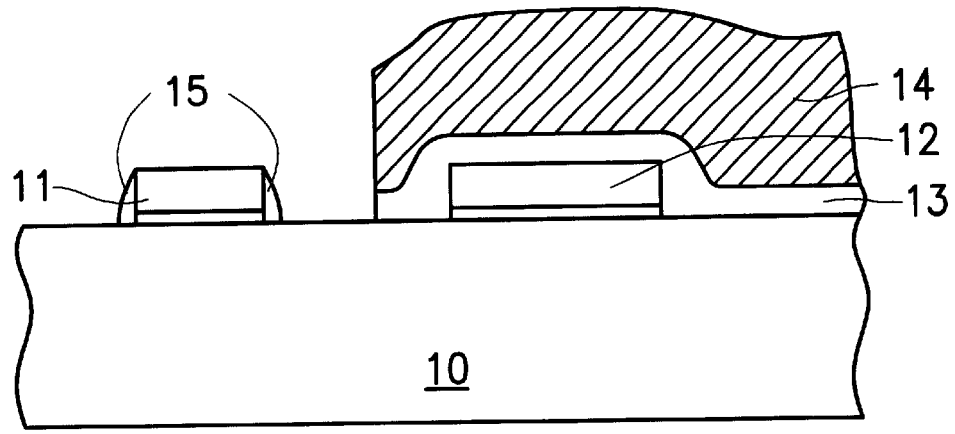

Referring further to FIG. 1D, a first etching process is then performed on the wafer with the first photoresist layer 14 serving as an etching mask, whereby the exposed portions of the insulating layer 13 that are uncovered by the first photoresist layer 14 are partly etched away, leaving a remaining part (as indicated by the reference numeral 15) on the sidewalls of the first gate 11. This remaining part 15 of the insulating layer 13 serves as a first spacer structure for the first gate 11. During this etching process, the width of the first spacer structure 15 can be controlled to a desired value by controlling etching variables such as the radio frequency power, the etching time, the gas flow rate of the etchant, and the chamber pressure used in the etching process. The use of these factors to control the width of the spacer structure 15 is a conventional technique, so no details thereof will be described herein. After the first spacer structure 15 is formed, the first photoresist layer 14 is removed.

Figure 1E:
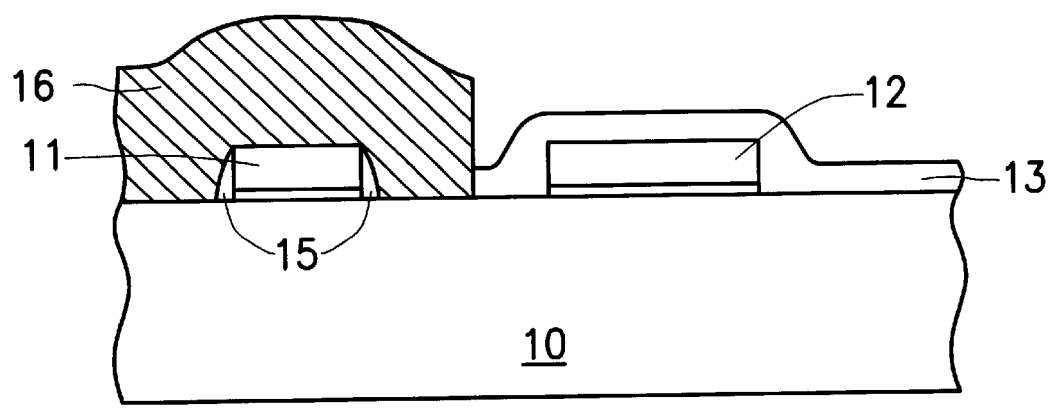

Referring next to FIG. 1E, in the subsequent step, a second photoresist layer 16 is formed over the wafer, which is then selectively removed to serve as an etching mask that covers the first gate 11 and the first spacer structure 15 while exposing the surface area of the insulating layer 13 above the second gate 12.

Figure 1F:
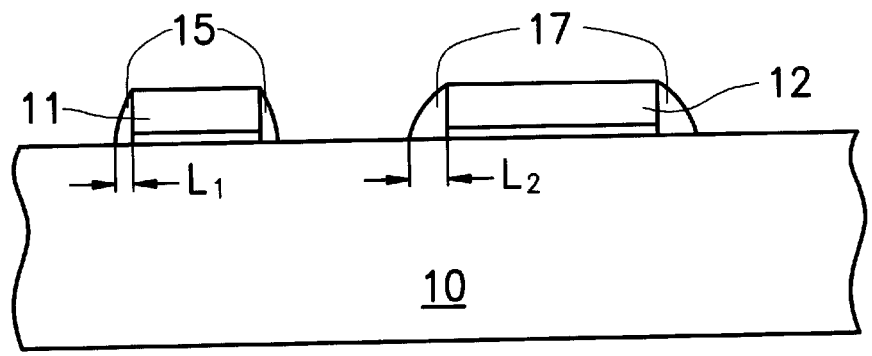

Referring next to FIG. 1F, a second etching process is then performed on the wafer with the second photoresist layer 16 serving as an etching mask, whereby the exposed portions of the insulating layer 13 that are uncovered by the second photoresist layer 16 are partly etched away, leaving a remaining part (as indicated by the reference numeral 17) on the sidewalls of the second gate 12. This remaining part 17 of the insulating layer 13 serves as a second spacer structure for the second gate 12. Similarly, during this etching process, the width of the second spacer structure 17 can be controlled to a desired value by controlling etching variables such as the radio frequency power, the etching time, the gas flow rate of the etchant, and the chamber pressure used in the etching process. In the case of FIG. 1F, for example, the width $L_1$ of the first spacer structure 15 is smaller than the width $L_2$ of the second spacer structure 17. After the second spacer structure 17 is formed, the second photoresist layer 16 is removed. This completes the forming of two spacer structures 15, 17 with different widths $L_1$, $L_2$ in the same integrated circuit.

Second Preferred Embodiment

FIGS. 2A through 2E are schematic diagrams used to depict the steps involved in the second preferred embodiment of the method of the invention for forming a number of, for example two, separated spacer structures in a mixed-mode integrated circuit.

Figure 2A:
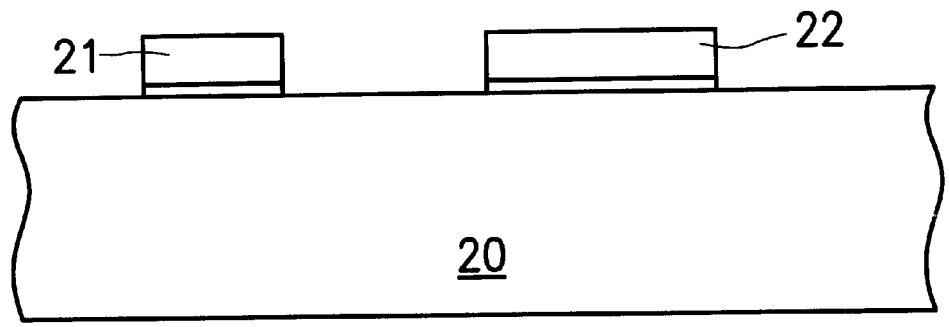
FIGS. 2A through 2E are schematic diagrams used to depict the steps involved in a second preferred embodiment of the method of the invention for forming two separated spacer structures in a mixed-mode integrated circuit.

Referring to FIG. 2A, in the first step, a semiconductor substrate 20 is prepared, which is then formed with a first gate 21 for the first kind of semiconductor device in the mixed-mode integrated circuit and a second gate 22 for the second kind of semiconductor device in the integrated circuit. In the case of FIG. 2A, for example, the first gate 21 is smaller in width than the second gate 22. In a practical case, for example, the width of the first gate 21 is 0.25 $\mu$m; while the width of the second gate 22 is 0.34 $\mu$m or 0.5 $\mu$m.

Figure 2B:
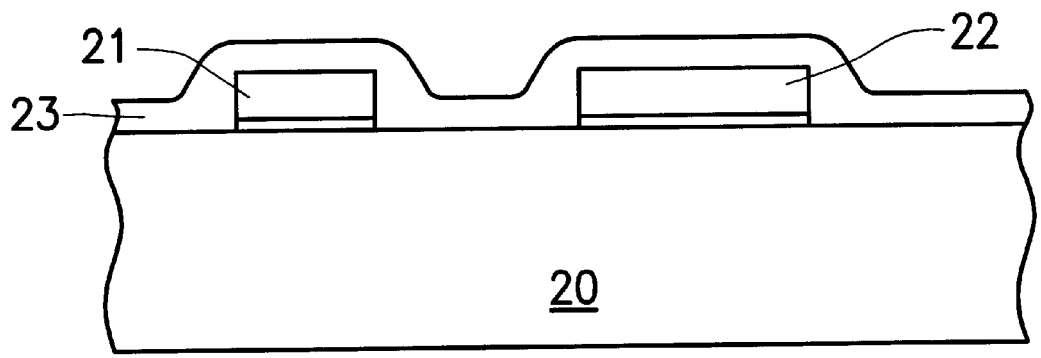

Referring next to FIG. 2B, in the subsequent step, an insulating layer 23, such as a layer of oxide or silicon nitride (SiN), is formed over the entire top surface of the wafer to a thickness of from 500 Å to 3,000 Å, covering both of the first gate 21 and the second gate 22.

Figure 2C:
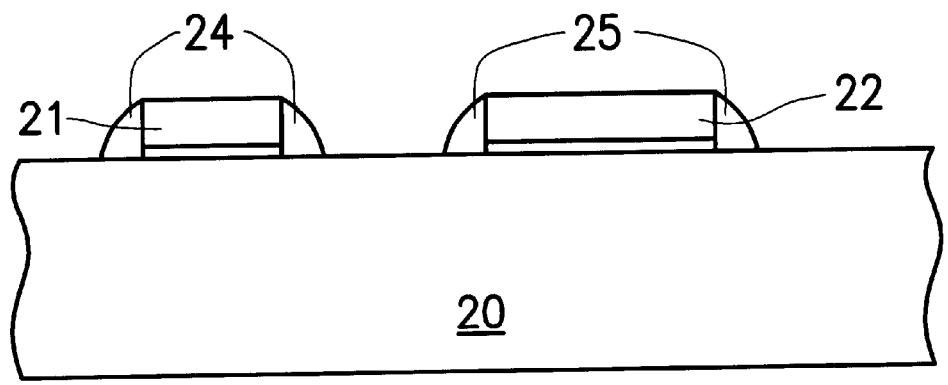

Referring next to FIG. 2C, in the subsequent step, a first etching process is performed on the entire wafer (referred to as a blanket etching process), whereby the insulating layer 23 is partly etched away, leaving a first remaining part (as indicated by the reference numeral 24) and a second remaining part (as indicated by the reference numeral 25) respectively on the sidewalls of the first gate 21 and the sidewalls of the second gate 22. The first remaining part 24 serves as a first spacer structure for the first gate 21, and the second remaining part 25 serves as a second spacer structure for the second gate 22. Since the first and second spacer structures 24, 25 are formed through the same etching process, they are formed with substantially the same width which is the larger one of the two desired widths. This width of the first and second spacer structures 24, 25 can be controlled to any desired value by controlling etching variables such as the radio frequency power, the etching time, the gas flow rate of the etchant, and the chamber pressure used in the etching process.

Figure 2D:
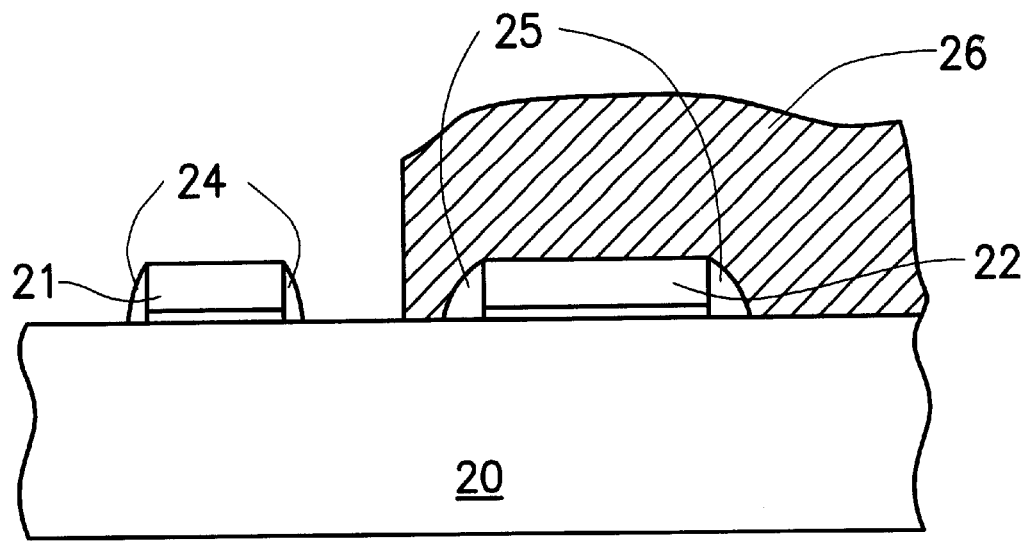

Referring further to FIG. 2D, in the subsequent step, a photoresist layer 26 is formed over the wafer, which is then selectively removed to serve as an etching mask that covers the second gate 22 and the second spacer structure 25 while exposing the first gate 21 and the first spacer structure 24.

Subsequently, a second etching process is performed on the wafer with the photoresist layer 26 serving as etching mask, whereby a surface part of the first spacer structure 24 is further etched away until the width thereof reaches the desired value. The width of the finally resultant first spacer structure 24 can be controlled by controlling etching variables such as the radio frequency power, the etching time, the gas flow rate of the etchant, and the chamber pressure used in the etching process.

Figure 2E:
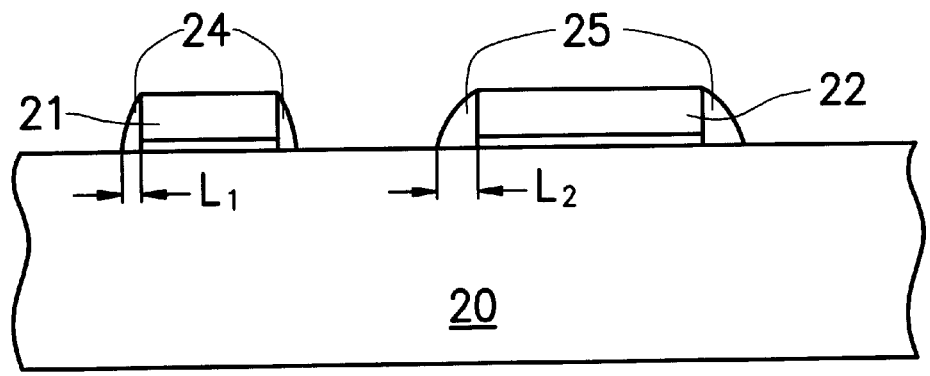

Referring finally to FIG. 2E, after the second etching process reduces the first spacer structure 24 to the desired width, the photoresist layer 26 is removed. This completes the forming of two spacer structures 24, 25 with different widths $L_1$, $L_2$ in the same integrated circuit.

In conclusion, the method of the invention has several advantages. First, the method of the invention utilizes a two-step etching process that allows the respective gate structures of two different semiconductor devices in the same mixed-mode integrated circuit to be formed with respective spacer structures of different widths. This advantage can help the further downsizing of the mixed-mode integrated circuit. Second, the various widths of the spacer structures for different devices can be arbitrarily adjusted by controlling etching variables such as the radio frequency power, the etching time, the gas flow rate of the etchant, and the chamber pressure used in the etching process, which is easy to carry out.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of forming separated spacer structures in a mixed-mode integrated circuit including at least a first kind of device and a second kind of device, comprising the steps of:

(1) preparing a semiconductor substrate formed with at least a first gate for the first kind of device of the mixed-mode integrated circuit and a second gate for the second kind of device of the mixed-mode integrated circuit;

(2) forming an insulating layer covering the first gate and the second gate;

(3) forming a first etching mask covering a first surface area of the insulating layer that is located above the second gate while exposing a second surface area of the insulating layer located above the first gate;

(4) performing a first etching process on the insulating layer to remove part of the insulating layer using the first etching mask, so that a remaining part of the insulating layer forms a first spacer on a sidewall of the first gate, wherein the first spacer is etched to a first width by adjusting etching recipe contents used in the first etching process;

(5) removing the first etching mask;

(6) forming a second etching mask covering the first gate and the first spacer structure while exposing a surface area of the insulating layer above the second gate;

(7) performing a second etching process on the insulating layer to remove part of the insulating layer using the second etching mask, so that a remaining part of the insulating layer forms a second spacer on a sidewall of the second gate, wherein the second spacer is etched to a second width by adjusting etching recipe contents used in the second etching process, the second width being different from the first width; and (8) removing the second etching mask.

2. The method of claim 1, wherein the second gate is larger in width than the first gate.

3. The method of claim 1, wherein in said step (2), the insulating layer is formed to a thickness of from 500 Å to 3,000 Å.

4. The method of claim 1, wherein in said step (2), the insulating layer is a layer of oxide.

5. The method of claim 1, wherein in said step (2), the insulating layer is a layer of silicon nitride.

6. The method of claim 1, wherein the second spacer structure is larger in width than the first spacer structure.

7. The method of claim 1, wherein in said step (4) the first spacer structure is etched to the first width by adjusting the radio frequency power used in the first etching process.

8. The method of claim 1, wherein in said step (4) the first spacer structure is etched to the first width by adjusting the over etching time used in the first etching process.

9. The method of claim 1, wherein in said step (4) the first spacer structure is etched to the first width by adjusting the gas flow rate of etchant used in the first etching process.

10. The method of claim 1, wherein in said step (4) the first spacer structure is etched to the first width by adjusting the chamber pressure used in the first etching process.

11. The method of claim 1, wherein in said step (6) the second spacer structure is etched to the second width by adjusting the radio frequency power used in the second etching process.

12. The method of claim 1, wherein in said step (6) the second spacer structure is etched to the second width by adjusting the over etching time used in the second etching process.

13. The method of claim 1, wherein in said step (6) the second spacer structure is etched to the second width by adjusting the gas flow rate of etchant used in the second etching process.

14. The method of claim 1, wherein in said step (6) the second spacer structure is etched to the second width by adjusting the chamber pressure used in the second etching process.

15. A method for forming separated spacer structures in a mixed-mode integrated circuit including at least a first kind of device and a second kind of device, comprising the steps of:

(1) preparing a semiconductor substrate formed with at least a first gate for the first kind of device of the mixed-mode integrated circuit and a second gate for the second kind of device of the mixed-mode integrated circuit, the second gate being larger in width than the first gate, the first gate being formed with a first spacer structure, having a first width, on the sidewalls thereof while the second gate is formed with a second spacer structure, having a second width, on the sidewalls thereof, the second width being larger than the first width;

(2) forming an insulating layer covering the first gate and the second gate;

(3) performing a first etching process on the insulating layer to remove part of the insulating layer until a first remaining part and a second remaining part, serving respectively as a first spacer structure and a second spacer structure, are left on sidewalls of the first gate and the second gate respectively, the first and second spacer structures being etched to the second width;

(4) forming an etching mask covering the second gate and the second spacer structure while exposing the first gate and the first spacer structure;

(5) performing a second etching process on the first spacer structure using the etching mask to remove a surface part of the first spacer structure until a width of the first spacer structure is reduced to the first width; and (6) removing the second etching mask.

16. The method of claim 15, wherein in said step (2) the insulating layer is formed to thickness of from 500 Å to 3,000 Å.

17. The method of claim 15, wherein in said step (2) the insulating layer is a layer of oxide.

18. The method of claim 15, wherein in said step (2) the insulating layer is a layer silicon nitride.

19. The method of claim 15, wherein in said step (3), the first and second spacer structures are etched to the second width by adjusting the radio frequency power used in the first etching process.

20. The method of claim 15, wherein in said step (3), the first and second spacer structures are etched to the second width by adjusting the over etching time used in the first etching process.

21. The method of claim 15, wherein in said step (3), the first and second spacer structures are etched to the second width by adjusting the gas flow rate of etchant used in the first etching process.

22. The method of claim 15, wherein in said step (3), the first and second spacer structures are etched to the second width by adjusting the chamber pressure used in the first etching process.

23. The method of claim 15, wherein in said step (5), the first spacer structure is etched to the first width by adjusting the radio frequency power used in the second etching process.

24. The method of claim 15, wherein in said step (5), the first spacer structure is etched to the first width by adjusting the over etching time used in the second etching process.

25. The method of claim 15, wherein in said step (5), the first spacer structure is etched to the first width by adjusting the gas flow rate of etchant used in the second etching process.

26. The method of claim 15, wherein in said step (5), the first spacer structure is etched to the first width by adjusting the chamber pressure used in the second etching process.

* * * * *